United States Patent
Shen et al.

(10) Patent No.: US 10,840,927 B1
(45) Date of Patent: Nov. 17, 2020

(54) LOW POWER CURRENT STEERING DIGITAL-TO-ANALOG CONVERTER

(71) Applicant: SYNAPTICS INCORPORATED, San Jose, CA (US)

(72) Inventors: Dan Shen, Irvine, CA (US); Balakishan Challa, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/414,600

(22) Filed: May 16, 2019

(51) Int. Cl.
| | | |
|---|---|---|
| H03M 1/66 | (2006.01) | |
| H03M 1/00 | (2006.01) | |
| H03M 1/06 | (2006.01) | |
| H03M 1/10 | (2006.01) | |

(52) U.S. Cl.
CPC .......... *H03M 1/002* (2013.01); *H03M 1/0604* (2013.01); *H03M 1/66* (2013.01); *H03M 1/00* (2013.01); *H03M 1/10* (2013.01); *H03M 1/664* (2013.01)

(58) Field of Classification Search
CPC .......... H03M 1/66; H03M 1/664; H03M 1/00; H03M 1/10

USPC .......... 341/144, 136, 135, 142, 120
See application file for complete search history.

(56) References Cited

U.S. PATENT DOCUMENTS

| | | | |
|---|---|---|---|
| 5,489,902 A | * | 2/1996 | Shyu ............ H03M 1/002 341/136 |
| 8,872,685 B2 | | 10/2014 | Song et al. |
| 9,397,676 B1 | | 7/2016 | Nguyen |
| 10,243,574 B2 | | 3/2019 | Kauffman et al. |

* cited by examiner

*Primary Examiner* — Joseph J Lauture
(74) *Attorney, Agent, or Firm* — Haynes and Boone, LLP

(57) ABSTRACT

Systems and methods according to one or more embodiments provide a low power current steering digital-to-analog converter. In one example, a device includes a current cell including a plurality of switches. The device further includes a current cell controller configured to selectively operate the plurality of switches. The plurality of switches is selectively operated to cause the current cell to generate a current signal in response to a first data signal. The plurality of switches is selectively operated to disable the current cell in an absence of the first data signal. The plurality of switches is selectively operated to transition the current cell to a common mode state before the current cell receives the first data signal. Related systems and methods are also provided.

20 Claims, 5 Drawing Sheets

LOW POWER CURRENT STEERING DIGITAL-TO-ANALOG CONVERTER

TECHNICAL FIELD

The present disclosure, in accordance with one or more embodiments, relates generally to digital signal processing and, more particularly for example, to improving efficiency of low power digital-to-analog converters.

BACKGROUND

Many modern devices such as laptop computers, computer tablets and smart phones include digital-to-analog converters to convert digital audio signals to corresponding analog audio signals. Digital-to-analog converters are often implemented as high power efficient current steering digital-to-analog converters (DACs) that include a plurality of current cells configured to generate a corresponding analog audio signal. The analog audio signal may then be provided, for example, to an amplifier output stage to drive a speaker. There is a continued need to lower power consumption and increase battery life of modern portable devices. Powering down audio circuitry such as current steering digital-to-analog converters, however, can produce distortion at the output of the DAC that results in degradation of audio signal quality. In view of the foregoing, there is a continued need in the art for improved power efficiency and performance of current steering DACs.

SUMMARY

Novel current steering digital-to-analog converter systems and methods that address various needs in the art are provide herein. In one or more embodiments, a device includes a current cell including a plurality of switches. The device further includes a current cell controller configured to selectively operate the plurality of switches. The plurality of switches is selectively operated to cause the current cell to generate a current signal in response to a first data signal. The plurality of switches is selectively operated to disable the current cell in an absence of the first data signal. The plurality of switches is selectively operated to transition the current cell to a common mode state before the current cell receives the first data signal. Related systems and methods are also provided.

In one or more embodiments, a method of operating a current steering digital-to-analog converter is provided. The method includes receiving, by a current cell controller, a first data signal. The method further includes transitioning a current cell to a common mode state before the current cell receives the first data signal. The method further includes generating a current signal at the current cell responsive to the first data signal. The method further includes disabling the current cell in an absence of the first data signal.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

The present disclosure describes novel current steering digital-to-analog converter systems and methods that address various needs in the art. The current steering digital-to-analog converters disclosed herein may be implemented in a variety of devices, such as mobile phones, tablets, wearables, listening devices and portable computers, for example.

A current steering DAC of the present disclosure may be used, for example, to convert digital audio signals to corresponding analog audio signals for output through a loudspeaker. Many conventional current steering DACs are implemented for type A operation, in which all current cells remain active during periods when there is no digital input signal. Power savings may be achieved by powering down DAC current cells when there is no digital input signal. However, this approach increases the likelihood of distortion at the output of the DAC and produces a resulting degradation of audio signal quality. The systems and methods disclosed herein allow for reduced power consumption of a current steering DAC without a corresponding degradation of audio signal quality. In various embodiments, the current steering DAC is implemented in a class B amplifier driver circuit, for example. It will be appreciated that the current steering DACs disclosed herein may be implemented in other types of driver amplifier circuits such as, for example, class AB operation, and other digital-to-analog implementations.

Figure 1:
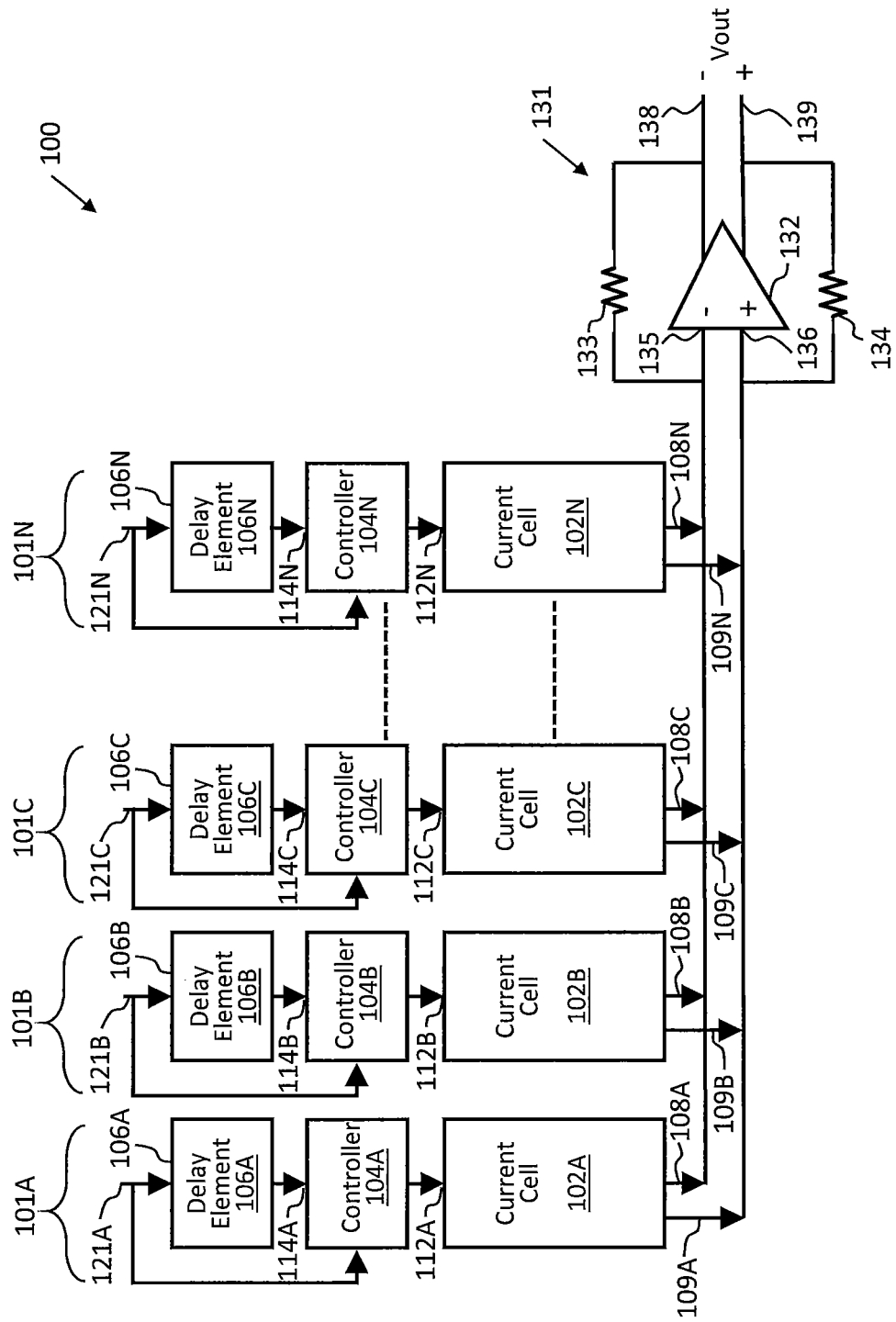
FIG. 1 illustrates a schematic diagram of an N-bit current steering digital-to-analog converter, in accordance with one or more embodiments of the disclosure.

FIG. 1 illustrates a schematic diagram of an exemplary N-bit current steering digital-to-analog converter 100 in accordance with one or more embodiments of the disclosure. In some embodiments, the N-bit current steering digital-to-analog converter 100 forms part of an audio amplifier circuit. As illustrated, the N-bit current steering digital-to-analog converter 100 is implemented as a differential N-bit current steering digital-to-analog converter.

As shown in FIG. 1, the N-bit current steering digital-to-analog converter 100 includes a plurality of each of current cells 102A-102N, current cell controllers 104A-104N, and delay elements 106A-106N. In some embodiments, the N-bit current steering digital-to-analog converter 100 includes a conversion circuit 131 to convert the current signals to a corresponding differential voltage signal Vout. The N-bit current steering digital-to-analog converter 100 includes a plurality of digital-to-analog converters 101A-101N, in which each one of the digital-to-analog converters 101A-101N includes one each of the current cells 102A-102N, current cell controllers 104A-104N, and delay elements 106A-106N. In this regard, for example, the digital-to-analog converter 101A includes the current cell 102A, current cell controller 104A, and delay element 106A, the digital-to-analog converter 101B includes the current cell 102B, current cell controller 104B, and delay element 106B, and so forth for the digital-to-analog converters 101C-101N.

In some embodiments, the N-bit current steering digital-to-analog converter 100 may be implemented as a 32-bit current steering digital-to-analog converter including thirty-two digital-to-analog converters (i.e., thirty-two current cells, thirty-two current cell controllers, and thirty-two delay elements). In these embodiments, each of the digital-to-analog converters 101A-101N, current cells 102A-102N, current cell controllers 104A-104N, and delay elements 106A-106N may be associated with one bit of the 32-bit current steering digital-to-analog converter. It should be appreciated that, in other embodiments, N may be greater than or fewer than thirty-two.

Each of the digital-to-analog converters 101A-101N receives a corresponding one of input digital signals 121A-121N. In this regard, for example, the digital-to-analog converter 101A receives the input digital signal 121A, the digital-to-analog converter 101B receives the input digital signal 121B, and so forth. It will be understood that the operational features of each of the digital-to-analog converters 101A-101N is identical, and, for the sake of brevity, operation of the digital-to-analog converter 101A is described.

The digital-to-analog converter 101A receives the input digital signal 121A at the delay element 106A. The delay element 106A is coupled between the input digital signal 121A (e.g., input data signal) and current cell controller 104A to delay the input digital signal 121A for a period of time prior to the input digital signal 121A being detected at the current cell controller 104A. In this regard, the input digital signal 121A is detected at (e.g., received by) the current cell controller 104A at a certain time according to the delay imposed on the input digital signal 121A by the delay element 106A. In some embodiments, the delay element 106A delays the input digital signal 121A for at least one period of a clock cycle (e.g., not shown) prior to passing a delayed input digital signal 114A (e.g., a delayed version of the input digital signal 121A) to the current cell controller 104A. For instance, in some cases, the delay element 106A may delay the input digital signal 121A for more than one period of a clock cycle. After the delay of one or more clock cycles, the delay element 106A passes the delayed input digital signal 114A to the current cell controller 104A for further processing, as described herein.

The current cell controllers 104A generates control signals 112A to selectively operate a plurality of switches (e.g., such as switches 202-207 of a current cell 102 shown in FIGS. 2A-2D) of the current cell 102A. The current cell controller 104A may generate the control signals 112A based on (e.g., in response to receiving) the input digital signal 121A and/or the delayed input digital signal 114A, as described herein. In some embodiments, the current cell controller 104A selectively operates, using the control signals 112A, the plurality of switches of the current cell 102A to cause the current cell 102A to generate a current signal in response to receiving the delayed input digital signal 114A (e.g., input data signal). As shown in FIG. 1, the current cells 102A-102N provide differential current signals 108A-108N and 109A-109N in the form of differential current signal pairs. In this regard, the current cell 102A generates a differential current signal pair 108A and 109A, and the current cells 102B-102N generate their respective differential current signal pairs 108B-N and 109B-N. In addition, the current cell controller 104A selectively operates the plurality of switches to disable the current cell 102A in the absence of the delayed input digital signal 114A (e.g., input data signal).

The input digital signal 121A is also received at the current cell controller 104A in parallel to being received at the delay element 106A. In some embodiments, the current cell controller 104A selectively operates a plurality of switches (e.g., such as the switches 202-207 of the current cell 102 shown in FIGS. 2A-2D) to transition the current cell 102A to a common mode state when the input digital signal 121A is received at the current cell controller 104A, as described herein. In some embodiments, the common mode state causes the current cell 102A to turn on and current of the current cell 102A to be confined inside the current cell 102A. In this regard, in the common mode state, current does not flow to output nodes Top and Ion. With such current flow confined inside the current cell 102A, a common mode voltage associated with the current cell 102A is approximately equal to a common mode voltage of the conversion circuit 131. The remaining current cell controllers 104B-104N generate corresponding control signals 112B-112N to selectively operate a respective plurality of switches of the current cells 102B-102N.

The conversion circuit 131 is coupled to the current cells 102A-102N to receive a current signal from the current cells 102A-102N and convert the current signals to a corresponding differential voltage signal Vout. In this regard, the differential current signals 108A-108N and 109A-109N are summed at a differential input port 135 and differential input port 136, respectively, of a differential amplifier 132. A current signal may be a positive current signal, a negative current signal, or a zero current signal (e.g., also referred to as no current signal). For instance, the current signal may be a zero current signal when the current cell 102A is in the common mode state. The voltage signal Vout is provided across a differential output port 138 and a differential output port 139 of the differential amplifier 132. The differential amplifier 132 includes a feedback resistor 133 and feedback resistor 134 to convert the current signal (e.g., summed differential current signals 108A-108N and 109A-109N) to the voltage signal Vout.

FIGS. 2A-2D illustrate schematic diagrams of exemplary current cells in accordance with one or more embodiments of the disclosure. In particular, FIGS. 2A-2D show various states of a current cell 102. In an aspect, the current cell 102 may be any one of the current cells 102A-102N of FIG. 1. The current cell 102 includes switches 202-207, a current source (e.g., implemented using a p-type metal-oxide-semiconductor (PMOS) transistor 210 in FIGS. 2A-2D), and a current sink (e.g., implemented using an n-type MOS (NMOS) transistor 212 in FIGS. 2A-2D). A current cell controller controls the switches 202-207 of the current cell 102 to place the current cell 102 in one of an "off" state, a "1" state, a "−1" state, or a "common mode state". For example, in a case that the current cell 102 is the current cell 102A, the current cell controller 104A controls the switches 202-207. In this regard, FIGS. 2A, 2B, 2C, and 2D show the current cell 102 is in an "off" state, a common mode state, a "1" state, and a "−1" state, respectively. The "1" state and "−1" state may be referred to as current conducting states or "on" states.

Figure 2:
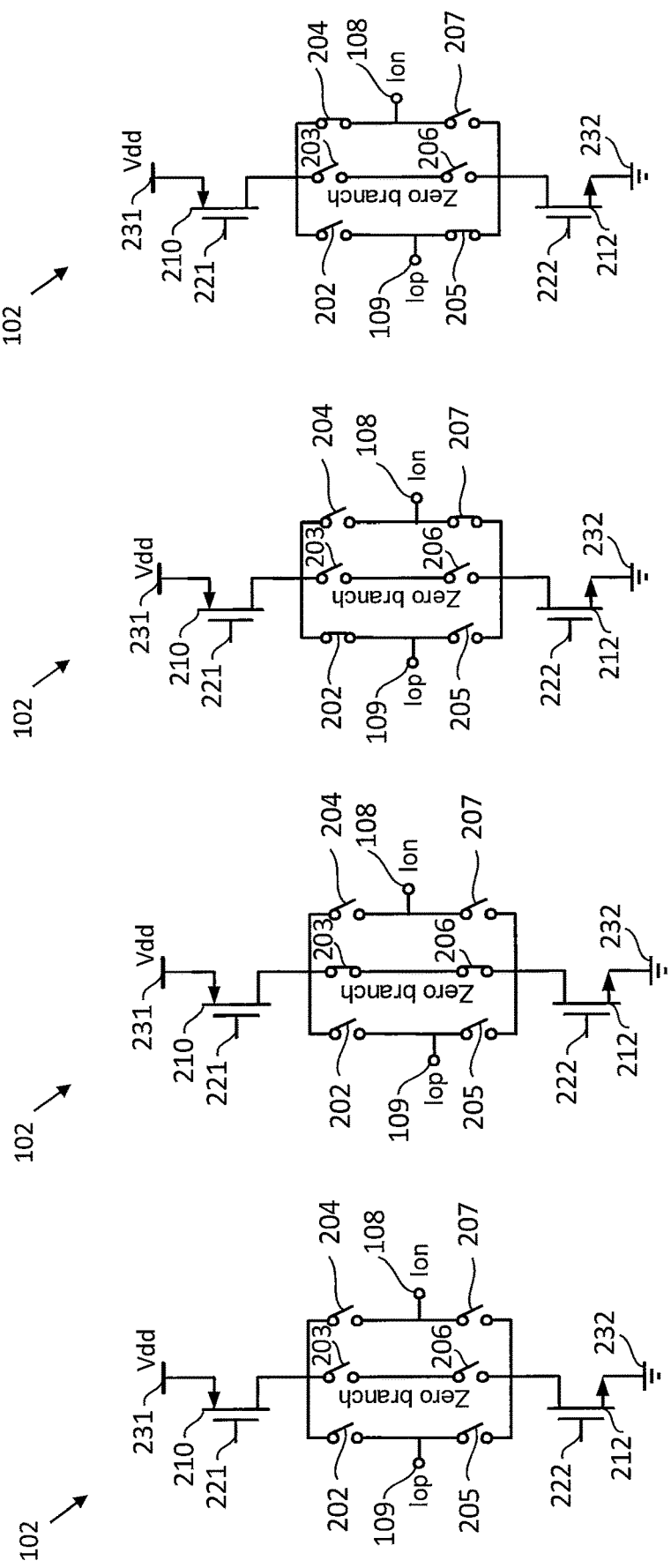
FIGS. 2A-2D illustrate schematic diagrams of current cells, in accordance with one or more embodiments of the disclosure.

Referring to FIG. 2A, in the "off" state, the switches 202-207 are open, resulting in no current flow to the differential input port 135 and differential input port 136 of the conversion circuit 131. When the current cell 102 is in the "off" state, a node that connects the switch 202, switch 203, and switch 204 to a drain terminal of the PMOS transistor 210 is approximately Vdd 231. Vdd 231 is provided at a voltage supply node. In some embodiments, Vdd 231 is a direct current (DC) voltage supply providing approximately five volts DC. Other DC voltages are possible in other embodiments. A node that connects the switch 205, switch 206, and switch 207 to a drain terminal of the NMOS transistor 212 is approximately ground 232. Such a node can be referred to as a ground node. An input bias signal 221 is applied to a gate terminal of the PMOS transistor 210 and an input bias signal 222 is applied to a gate terminal of the NMOS transistor 212. In an aspect, the input bias signals 221 and 222 are analog bias signals that nominally remain at a constant level during operation of the current cell 102. In this regard, the input bias signals 221 and 222 remain unchanged regardless of whether the current cell 102 is in the "off" state, the common mode state, or an "on" state. For instance, in this aspect, in FIG. 2A, the current cell 102 does not generate any current, even when the input bias signals 221 and 222 are at their proper bias voltages.

As the current cell 102 (e.g., one of the current cells 102A-102N) transitions from the "off" state to one of a current conducting state (e.g., "1" state or "−1" state), an initial surge of current flows into the differential input port 135 and differential input port 136 of the differential amplifier 132. The initial current surge generates distortion at the differential output port 138 and differential output port 139 of the differential amplifier 132. Typical methods to reduce distortion caused by changes in a state of the current cell 102 involve maintaining a current flow from the current cell 102 to the conversion circuit 131 during "off" state periods. As an example, in audio applications, such methods generally impact efficiency due to an increased power consumption in the N-bit current steering digital-to-analog converter 100 because of high crest factors in audio signal processing where there is a long period of low signals (e.g., where most current cells are not needed since output amplitude is low) for around ten to one hundred milliseconds followed by a short period of a high amplitude signal (e.g., where many of the current cells are needed to construct the high amplitude signal). In one example, the short period may be around 1 millisecond. In these applications, for a given current cell, an input digital signal of the current cell may be referred to as being active during the short period when there is an input digital signal (e.g., 121A is non-zero) provided to the current cell and as being inactive when there is no signal (e.g., 121A is zero) provided to the current cell.

FIG. 2B illustrates a common mode state of the current cell 102 (e.g., 102A). In the common mode state, the switch 203 and switch 206 are closed. The switch 203 and switch 206 are associated with a zero branch path. In this regard, the current cell controller (e.g., 104A) receives the input digital signal (e.g., 121A) and, if the current cell 102 is in the "off" state, the current cell controller generates control signals (e.g., 112A) to close the switch 203 and switch 206, thus transitioning the current cell 102 from the off state to the common mode state. The common mode state causes the current cell 102 to turn on and current to flow. This current is confined inside the current cell 102. In this regard, in the common mode state, current does not flow to the output nodes Iop and Ion. With such current flow confined inside the current cell 102, a common mode voltage associated with current through the zero branch path of the current cell 102, as shown in FIGS. 2A-2D, approximately equal to a common mode voltage of a conversion circuit (e.g., 131). The common mode state of the current cell 102 provides a short period of time approximately equivalent to one or more clock cycles such that the current cell 102 and the common mode voltage of the conversion circuit are approximately equivalent prior to receiving control signals (e.g., subsequent to those control signals to close the switch 203 and switch 206) from the current cell controller to transition the current cell 102 to an on state, as illustrated in FIGS. 2C and 2D.

FIGS. 2C and 2D illustrate on states of the current cell 102. The current cell controller (e.g., 104A) generates control signals (e.g., 112A) to close the switch 202 and switch 207 to cause the current cell 102 to generate differential current signals (e.g., 108A and 109A) to produce a "1" state at the output nodes Top and Ion of the current cell 102. In a "1" state, current flows from a node associated with Vdd 231 through the switch 202 and to the output node Iop, and current flows from ground 232 through the switch 207 and to the output node Ion. Referring to FIG. 2D, the current cell controller (e.g., 104A) generates control signals (e.g., 112A) to close the switch 204 and switch 205 to cause the current cell 102 to generate differential current signals (e.g., 108A and 109A) to produce a "−1" state at the output nodes Top and Ion of the current cell 102. In a "−1" state, current flows from a node associated with Vdd 231 through the switch 204 and to the output node Ion, and current flows from ground 232 through the switch 205 and to the output node Iop. Whether the current cell 102 is transitioned to a "1" state or a "−1" state is based on a value of an input data signal (e.g., an audio signal) provided to the current cell 102. In an aspect, the control signals 112A of the current cell controller 104A collectively represent control signals to transition the current cell 102A to the common mode state as well as control signals to transition the current cell 102A to an appropriate on state.

Figure 3:
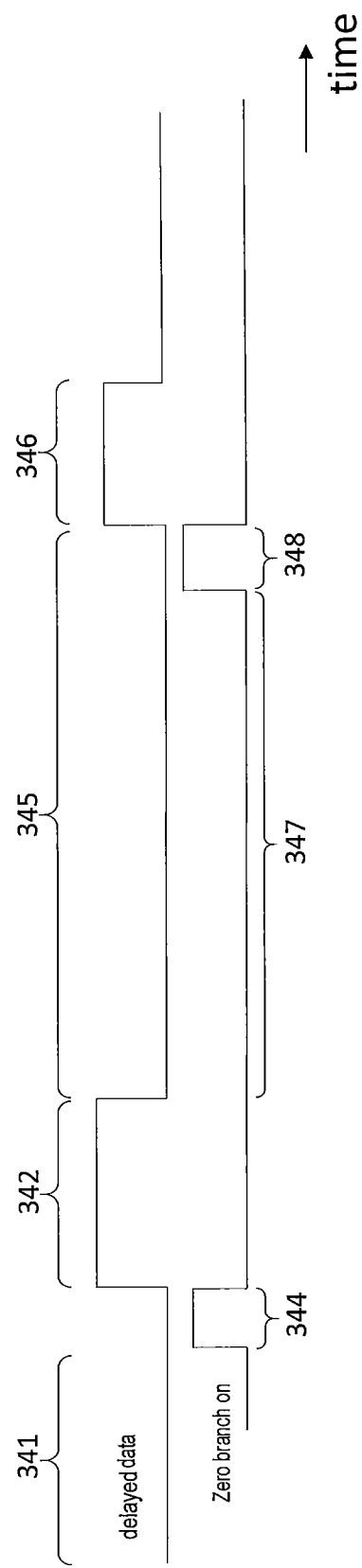
FIG. 3 illustrates an example current cell switching timing diagram, in accordance with one or more embodiments of the disclosure.

FIG. 3 illustrates an exemplary current cell switching timing diagram in accordance with one or more embodiments of the disclosure. FIG. 3 identifies a first time period 341 where input digital signal (e.g., 121A) is in an inactive state. In a second time period 344, the input data signal is in an active state, in which the input data signal is received as an input data pulse signal. When the current cell controller (e.g., 104A) receives the input digital signal (e.g., 121A) and if the current cell 102 is in the "off" state, the current cell controller generates control signals (e.g., 112A) appropriate to cause the switch 203 and switch 206 to close to transition the current cell 102 from the off state to the common mode state. During time period 344, the current cell 102 is in the common mode state. As shown in FIG. 3, the current cell 102 is in the common mode state prior to a delayed version of the input digital signal (e.g., delayed input digital signal 114A) being provided by a delay element (e.g., 106A) to the current cell controller.

After time period 344, the delayed input digital signal (e.g., 114A) is outputted from delay element 106 and provided to the current cell controller, and the current cell controller selectively operates the switches 202-207 to cause the current cell 102 to generate the current signal responsive to a first edge transition of the delayed input digital signal (e.g., the input data pulse signal) corresponding to an ON state (e.g., a "1" or "4" state). A value of the delayed input digital signal determines whether the current cell 102 is in the "1" state or the "−1" state. During time period 342, the delayed input digital signal is in an active state and the current cell 102 is in an ON state. The current cell controller selectively operates switches 202-207 to disable the current cell 102 responsive to a second edge transition of delayed input digital signal (e.g., the input data pulse signal) corresponding to an OFF state. In this regard, the current cell 102 is disabled (e.g., put in a disabled state) by transitioning the current cell 102 from an ON state (e.g., a "1" or "−1" state) to the OFF state through appropriate control of the switches 202-207 by the current cell controller. The second edge transition is indicative of the delayed input digital signal transitioning from being active to being inactive.

During time period 345, the delayed input digital signal is an inactive state. During time period 347, the current cell 102 is in the OFF state. During time period 348, the current cell 102 is in the common mode state. During time period 346, the delayed input digital signal is in an active state and the current cell 102 is in an ON state (e.g., 1 state or −1 state based on the delayed input digital signal). The current cell controller selectively operates the switches 202-207 as appropriate to transition between the various states of the current cell 102.

Figure 4:
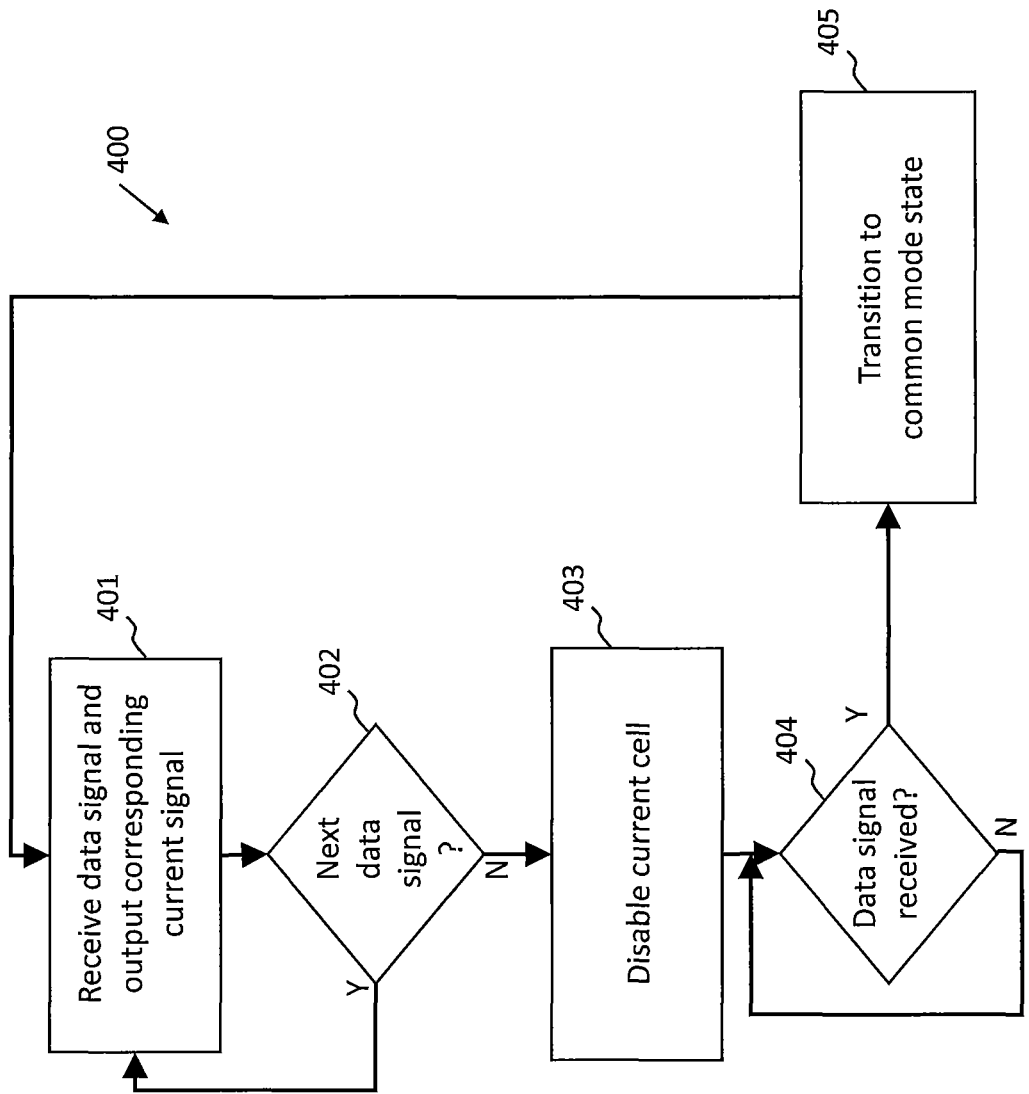
FIG. 4 is a flow chart illustrating a method for operating a current steering digital-to-analog converter, in accordance with one or more embodiments of the disclosure.

FIG. 4 is a flow chart illustrating a method 400 for operation of a current steering digital-to-analog converter in accordance with one or more embodiments of the disclosure. Method 400 begins with operations of step 401. In one embodiment, a current cell (e.g., 102A) receives a delayed input digital signal (e.g., 114A) from a current cell controller (e.g., 104A) and provides a corresponding current signal to a conversion circuit (e.g., 131). The conversion circuit converts the current signal to a voltage signal Vout that is passed to an amplifier for amplification prior to sending to a speaker, for example.

Method 400 may further include operations (step 402) of determining if a next signal is another delayed input digital signal. If the next signal is another delayed input digital signal, the method moves to step 401. In some embodiments, if the next signal is not another delayed input digital signal, method 400 moves to step 403. Step 403 may include operations of to disable the current cell in the absence of an input digital signal at a delay element (e.g., 106A). In some embodiments, the current cell controller selectively operates switches (e.g., 202-207) of the current cell to disable the current cell.

Method 400 may further include operations (step 404) of determining if a next signal is a subsequent delayed input digital signal. If the next signal is not a subsequent delayed input digital signal, method 400 moves remains at step 404. If the subsequent signal is a delayed input digital signal, the method moves to step 405. Step 405 may include operations of the current cell controller receiving an input digital signal (e.g., 121A) and, if the current cell is in the "off" state, the current cell controller generates control signals (e.g., 112A) to selectively operate switches of the current cell to cause the current cell to transition to the common mode state. In this regard, the current cell turns on and provides current flow confined inside the current cell. A common mode voltage associated with the current cell is approximately equal to a conversion circuit common mode voltage. Method 400 may then revert to step 401 of receiving the next delayed input digital signal 114 at current cell 102.

Figure 5:
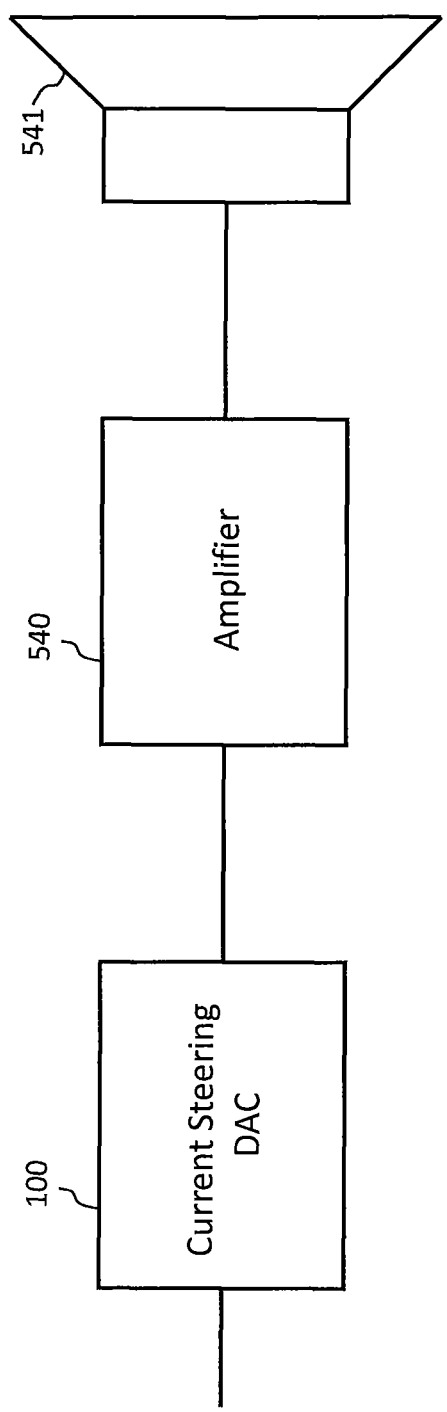
FIG. 5 illustrates a block diagram of an example driver amplifier including an N-bit current steering digital-to-analog converter, in accordance with one or more embodiments of the disclosure.

FIG. 5 illustrates an exemplary block diagram of a driver amplifier including an N-bit current steering digital-to-analog converter 100 in accordance with one or more embodiments of the disclosure. As shown in FIG. 5, a circuit to drive a speaker 541 may include N-bit current steering digital-to-analog converter 100 and an amplifier 540. In some embodiments, the N-bit current steering digital-to-analog converter 100 may be operating in a class B amplifier driver circuit, where the amplifier 540 is a class B amplifier. In other embodiments, N-bit current steering digital-to-analog converter may be operating in a class AB amplifier driver circuit, where the amplifier 540 is a class AB amplifier. In some embodiments, the N-bit current steering digital-to-analog converter 100 may be implemented as a 32-bit current steering digital-to-analog converter, but other bit resolution current steering digital-to-analog converters are possible in other embodiments.

Where applicable, various embodiments provided by the present disclosure may be implemented using hardware, software, or combinations of hardware and software. Also, where applicable, the various hardware components and/or software components set forth herein may be combined into composite components comprising software, hardware, and/ or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A device comprising:
   a current cell comprising a plurality of switches; and
   a current cell controller configured to selectively operate the plurality of switches to:
   cause the current cell to generate a current signal in response to a first data signal comprising a first input data pulse signal and a second input data pulse signal;
   enable the current cell responsive to a first edge transition of the first input data pulse signal and transition to a common mode state before the first edge of the second input data pulse signal;
   output a differential signal in the presence of a first edge transition of the second input data pulse signal; and
   disable the current cell responsive to a second edge transition of the first input data pulse signal.

2. The device of claim 1, wherein the current cell further comprises a current source and/or a current sink coupled to the plurality of switches.

3. The device of claim 1, further comprising a delay element coupled to the current cell controller, wherein the delay element is configured to delay the first transition edge of the first data signal to obtain the first transitional edge of a second data signal.

4. The device of claim 1, further comprising a delay element coupled to the current cell controller, wherein the delay element is configured to delay a second transition edge of a second data signal for a period of time to obtain the second transitional edge of the first data signal.

5. The device of claim 4, wherein the delay element is configurable and includes a delay equal to zero.

6. The device of claim 1, further comprising a conversion circuit coupled to the current cell, wherein the conversion circuit is configured to receive the current signal from the current cell and convert the current signal to a corresponding voltage signal.

7. The device of claim 6, wherein, in the common mode state:
the current cell is configured to allow current flow from a voltage supply node to a ground node, and
a common mode voltage associated with the current cell is approximately equal to a common mode voltage associated with the conversion circuit.

8. The device of claim 1, wherein the device comprises an N-bit digital-to-analog converter comprising a plurality of corresponding current cells, current cell controllers, and delay elements.

9. The device of claim 8, wherein the N-bit digital-to-analog converter comprises a plurality of digital-to-analog converters, and wherein each digital-to-analog converter comprises at least one of each of the current cells, the current cell controllers, and the delay elements.

10. The device of claim 1, wherein the device is a current steering digital-to-analog converter.

11. The device of claim 1, wherein each of the plurality of switches comprises a metal-oxide semiconductor transistor.

12. A method of operating a current steering digital-to-analog converter, the method comprising:
receiving, by a current cell controller, a first data signal comprising a first input data pulse signal and a second input data pulse signal;
enabling the current cell responsive to a first edge transition of the first input data pulse signal;
transitioning a current cell to a common mode state before the first edge of the second input data pulse signal is received;
generating a differential signal in the presence of a first edge transition of the second input data pulse signal; and
disabling the current cell responsive to a second edge transition of the first input data pulse signal.

13. The method of claim 12, wherein the transitioning comprises selectively operating, by the current cell controller, a plurality of switches of the current cell.

14. The method of claim 12, wherein the current cell further comprises a current source and/or a current sink coupled to the plurality of switches.

15. The method of claim 12, further comprising delaying, by a delay element, the first transition edge of the first data signal to obtain the first transition edge of a second data signal.

16. The method of claim 12, further comprising delaying, by a delay element, a second transition edge of a second data signal for a period of time to obtain the second transition edge of the first data signal.

17. The method of claim 16, further comprising receiving, by the current cell controller, the second data signal and, if the current cell is in a disabled state, causing, by the current cell controller, the current cell to transition to the common mode state before the current cell receives the first data signal.

18. The method of claim 12, further comprising:
receiving, by a conversion circuit, the current signal; and
converting, by the conversion circuit, the current signal to a corresponding voltage signal.

19. The method of claim 18, wherein, in the common mode state,
the current cell allows current flow from a voltage supply node to a ground node, and
a common mode voltage associated with the current cell is approximately equal to a common mode voltage associated with the conversion circuit.

20. The method of claim 12, wherein the current steering digital-to-analog converter comprises an N-bit digital-to-analog converter comprising a plurality of corresponding current cells, current cell controllers, and delay elements.

* * * * *